United States Patent
Shim

(10) Patent No.: US 9,401,219 B2
(45) Date of Patent: Jul. 26, 2016

(54) ELECTRONIC FUSE SEMICONDUCTOR DEVICE FOR SELECTING FAILED REDUNDANCY WORD LINES

(71) Applicant: SK hynix Inc., Icheon-si Gyeonggi-do (KR)

(72) Inventor: Young Bo Shim, Dangjin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/586,007

(22) Filed: Dec. 30, 2014

(65) Prior Publication Data

US 2016/0118139 A1     Apr. 28, 2016

(30) Foreign Application Priority Data

Oct. 24, 2014   (KR) .................. 10-2014-0145529

(51) Int. Cl.
    G11C 17/18    (2006.01)
    G11C 17/16    (2006.01)
    G11C 29/04    (2006.01)
    G11C 29/00    (2006.01)

(52) U.S. Cl.
    CPC ............... *G11C 17/18* (2013.01); *G11C 17/16* (2013.01); *G11C 29/04* (2013.01); *G11C 29/76* (2013.01); *G11C 29/78* (2013.01)

(58) Field of Classification Search
    CPC ........ G11C 17/18; G11C 29/04; G11C 29/78; G11C 17/16; G11C 29/76
    See application file for complete search history.

(56) References Cited

U.S. PATENT DOCUMENTS

| | | | |
|---|---|---|---|
| 2009/0190422 A1 | 7/2009 | Khoja et al. | |
| 2010/0254205 A1* | 10/2010 | Yamauchi | G11C 17/16 365/200 |
| 2013/0262740 A1* | 10/2013 | Kim | G06F 12/0246 711/102 |
| 2013/0322149 A1* | 12/2013 | Ryu | G11C 7/1045 365/96 |
| 2014/0126318 A1* | 5/2014 | Jeong | G11C 17/18 365/225.7 |

FOREIGN PATENT DOCUMENTS

KR    1020140085222 A    7/2014

\* cited by examiner

*Primary Examiner* — Vanthu Nguyen
*Assistant Examiner* — Jerome Leboeuf
(74) *Attorney, Agent, or Firm* — William Park & Associates Ltd.

(57) ABSTRACT

A semiconductor device with a fuse controller and a fuse array. The fuse controller may be configured to generate internal address signals according to a level combination of repair data and may generate first and second voltage control signals in response to a rupture control signal that is enabled to rupture a predetermined fuse set for selecting a failed redundancy word line, in a test mode. The fuse array may include a plurality of fuse sets including the predetermined fuse set. Each of the plurality of fuse sets may be selected according to a level combination of the internal address signals, and the fuse array ruptures the predetermined fuse set for selecting the failed redundancy word line in response to the first and second voltage control signals to output fuse data.

24 Claims, 6 Drawing Sheets

ELECTRONIC FUSE SEMICONDUCTOR DEVICE FOR SELECTING FAILED REDUNDANCY WORD LINES

CROSS-REFERENCE TO RELATED APPLICATION

The present application claims priority under 35 U.S.C 119(a) to Korean Application No. 10-2014-0145529, filed on Oct. 24, 2014, in the Korean Intellectual Property Office, which is incorporated herein by reference in its entirety as set forth in full.

BACKGROUND

1. Technical Field

Embodiments of the present disclosure relate to semiconductor devices.

2. Related Art

Semiconductor memory devices have increased in integration to increase data storage capacities thereof. Increasing in integration may increase a failure rate of the memory cells. In turn, these failures may reduce the fabrication yield of the semiconductor memory devices. In general, even if each semiconductor memory device has only one failed memory cell, the semiconductor memory device cannot be used as a commercial product.

A lot of effort has been exerted in an attempt to increase the fabrication yields of semiconductor memory devices. For example, various repairable design schemes have been employed in the semiconductor memory devices to attempt to increase a fabrication yield of the semiconductor memory devices.

Each of semiconductor devices may be designed to include fuses that store information necessary for various internal control operations. For example, repair information on abnormal memory cells. General fuses can be programmed using laser beams in a wafer level because a logic level of each data is determined according to an electrical open/short state of each fuse. However, once the semiconductor devices are encapsulated to form semiconductor packages, it may be impossible to program the general fuses in the semiconductor packages. E-fuses are widely used to solve the aforementioned disadvantage. Each of the e-fuses may be realized using a transistor, for example, a MOS transistor. In such a case, data may be stored in the e-fuse by changing an electrical resistance value between a gate terminal and a source/drain terminal of the MOS transistor used as the e-fuse. That is, the e-fuse may be electrically open or short according to a resistance value between the gate terminal and the source/drain terminal of the MOS transistor employed as the e-fuse.

In order to correctly recognize the data stored in the e-fuses, a size of the transistors employed as the e-fuses has to be increased or amplifiers have to be used without increasing the size of the transistors employed as the e-fuses. However, in any case, there may be limitations in increasing the integration density of the semiconductor devices including the e-fuses.

Recently, e-fuse arrays have been proposed to solve the limitations of the integration density and to store the information necessary for various internal control operations.

SUMMARY

According to an embodiment, a semiconductor device may include a fuse controller and a fuse array. The fuse controller is suitable for generating internal address signals according to a level combination of repair data and is suitable for generating first and second voltage control signals in response to a rupture control signal enabled to rupture a predetermined fuse set for selecting a failed redundancy word line, in a test mode. The fuse array may include a plurality of fuse sets including the predetermined fuse set. Each of the plurality of fuse sets may be selected according to a level combination of the internal address signals, and the fuse array may rupture the predetermined fuse set for selecting the failed redundancy word line in response to the first and second voltage control signals to output fuse data.

According to an embodiment, a semiconductor device may include a fuse controller, a fuse array, and a rupture controller. The fuse controller is suitable for generating internal address signals according to a level combination of repair data and is suitable for generating first and second voltage control signals in response to a rupture control signal, in a test mode. The fuse array is suitable for including a plurality of fuse sets selected according to a level combination of the internal address signals and is suitable for rupturing the plurality of fuse sets in response to the first and second voltage control signals to output a fuse data and an output data. The rupture controller is suitable for storing failure signals including information on a location of a failed redundancy word line of a plurality of redundancy word lines included in a memory cell array and is suitable for generating the rupture control signal according to a level combination of the failure signals in response to the output data.

DETAILED DESCRIPTION

Embodiments of the present disclosure will be described hereinafter with reference to the accompanying drawings. However, the embodiments described herein are for illustrative purposes only and are not intended to limit the scope of the present disclosure.

Various embodiments are directed to semiconductor devices.

Figure 1:
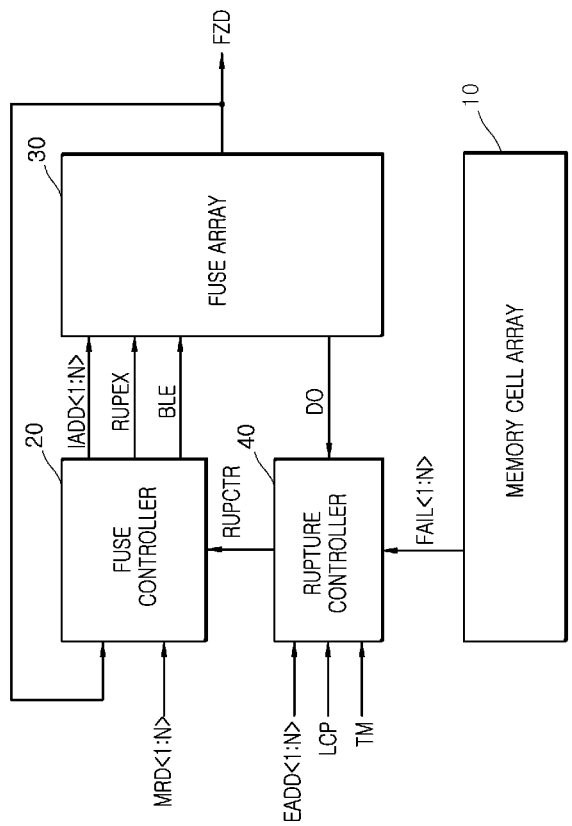
FIG. 1 is a block diagram illustrating a representation of semiconductor device according to an embodiment.

FIG. 1 is a block diagram illustrating a semiconductor device according to an embodiment of the present disclosure.

Please note, in the event that the e-fuse arrays are employed in the semiconductor devices, the e-fuse arrays may share amplifiers for amplifying the data stored in the e-fuses with each other. Accordingly, the integration density of the semiconductor devices may be improved Now referring to FIG. 1, a semiconductor device according to an embodiment may include a memory cell array 10, a fuse controller 20, a fuse array 30, and a rupture controller 40.

The memory cell array 10 may be tested in a redundancy test mode to generate first to $N^{th}$ failure signals FAIL<1:N> including information on locations of failed redundancy word lines (where N is a natural number). The memory cell array 10 may include a plurality of word lines and a plurality of redundancy word lines. The memory cell array 10 may further include a plurality of memory cells connected to the word lines and the redundancy word lines. During the redundancy test mode, data may be written into the memory cells. During the redundancy test mode, the data stored in the memory cells may be read out by sensing logic levels of the data in the memory cells to verify whether the memory cells normally function or not.

In a test mode, the fuse controller 20 may generate first to $N^{th}$ internal address signals IADD<1:N> (where N is a natural number). In the test mode, one of is the first to $N^{th}$ internal address signals IADD<1:N> may be selected according to a level combination of first to $N^{th}$ repair data MRD<1:N> (where N is a natural number). In the test mode, the fuse controller 20 may generate first and second voltage control signals RUPEX and BLE. In the test mode, one of first and second voltage control signals RUPEX may be selected according to a logic level of a rupture control signal RUPCTR. The test mode may be an operation for sequentially selecting a plurality of fuse sets (not illustrated) and for rupturing insulation layers of fuse sets that select the failed redundancy word lines among the plurality of redundancy word lines included in the memory cell array 10.

The fuse array 30 may include the plurality of fuse sets. One of fuse sets may be selected according to a level combination of the first to $N^{th}$ internal address signals IADD<1:N>. The fuse array 30 may rupture the fuse sets for selecting the failed redundancy word lines in response to the first and second voltage control signals RUPEX and BLE to generate fuse data FZD and output data DO. The plurality of fuse sets may be realized to include a plurality of transistor-type e-fuses, the plurality of transistor type e fuses' gate insulation layers can be ruptured by a voltage difference between two different voltages generated by the first and second voltage control signals RUPEX and BLE.

Operations of the semiconductor device in the test mode will be described hereinafter in conjunction with an example in which a selected fuse set is ruptured and an example in which a non-selected fuse set is not ruptured.

First, a high voltage may be applied to a first terminal (e.g., a gate terminal) of the selected fuse set if the first voltage control signal RUPEX is enabled. A ground voltage may be applied to a second terminal (e.g., a source/drain terminal) of the selected fuse set if the second voltage control signal BLE is enabled. Thus, a gate insulation layer of the the selected fuse set may be ruptured by a high voltage difference between the first and second terminals.

Next, a high voltage may be applied to a first terminal (e.g., a gate terminal) of the non-selected fuse set if the first voltage control signal RUPEX is enabled. An internal voltage having a level between the high voltage and the ground voltage may be applied to a second terminal (e.g., a source/drain terminal) of the non-selected fuse set if the second voltage control signal BLE is disabled. Thus, a gate insulation layer and the non-selected fuse set may not be ruptured because of a low voltage difference between the first and second terminals.

The rupture controller 40 may receive a test mode signal TM and a latch pulse signal LCP to store one of the first to $N^{th}$ failure signals FAIL<1:N> (where N is a natural number) therein according to a level combination of first to $N^{th}$ external address signals EADD<1:N> (where N is a natural number) and may receive the output data DO to generate the rupture control signal RUPCTR according to a level combination of the first to $N^{th}$ failure signals FAIL<LN>. The rupture control signal RUPCTR may be enabled to execute an operation for rupturing the fuse sets that select the failed redundancy word lines among the plurality of redundancy word lines included in the memory cell array 10.

Figure 2:
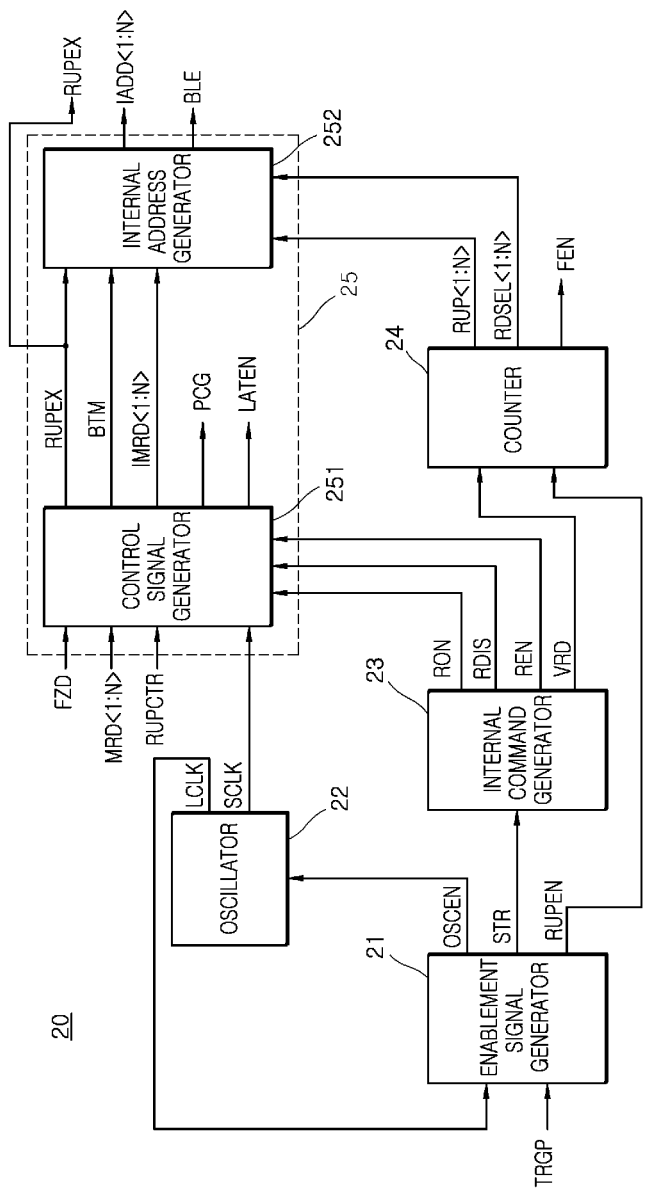
FIG. 2 is a block diagram illustrating a representation of a fuse controller included in the semiconductor device of FIG. 1.

Referring to FIG. 2, the fuse controller 20 may include an enablement signal generator 21, an oscillator 22, and an internal command generator 23. The fuse controller 20 may include a counter 24 and a voltage control signal generator 25.

The enablement signal generator 21 may generate an oscillator enablement signal OSCEN, a rupture enablement signal RUPEN, and a start signal STR. The oscillator enablement signal OSCEN, a rupture enablement signal RUPEN, and a start signal STR may be enabled in response to a pulse signal TRGP including a pulse that occurs in the test mode. In addition, the enablement signal generator 21 may receive a first internal clock signal LCLK to control a point of time that the oscillator enablement signal OSCEN, the rupture enablement signal RUPEN, and the start signal STR are generated.

The oscillator 22 may receive the oscillator enablement signal OSCEN to generate the first internal clock signal LCLK and a second internal clock signal SCLK. The first internal clock signal LCLK and the second internal clock signal SCLK may be toggled. A toggle cycle time of the first internal clock signal LCLK may be set to be greater than a toggle cycle time of the second internal clock signal LCLK. The toggle cycle times of the first and second internal clock signals LCLK and SCLK may be set to be different according to the various embodiments.

The internal command generator 23 may output a first internal command signal VRD, a second internal command signal REN, a third internal command signal RDIS, and a fourth internal command signal RON. The first internal command signal VRD, the second internal command signal REN, the third internal command signal RDIS, and the fourth internal command signal RON may be sequentially generated whenever the start signal STR is inputted into the internal command generator 23. The first internal command signal VRD may be generated to read the fuse data FZD, and the second internal command signal REN may be generated to execute an operation for rupturing the fuse sets. In addition, the third internal command signal RDIS may be generated to terminate the operation for rupturing the fuse sets, and the fourth internal command signal RON may be generated to read the fuse data FZD after the operation for rupturing the fuse sets.

The counter 24 may generate a fuse enablement signal FEN. The fuse enablement signal FEN may be enabled if the rupture enablement signal RUPEN is enabled. Moreover, the counter 24 may generate first to $N^{th}$ rupture signals RUP<1:N> (where N is a natural number) sequentially enabled if the first internal command signal VRD is inputted thereto. The counter 24 may generate first to $N^{th}$ selection signals RDSEL<1:N> (where N is a natural number) sequentially enabled if the first internal command signal VRD is inputted thereto. All bits of the first to $N^{th}$ rupture signals RUP<1:N> may be counted while any one bit of the first to $N^{th}$ selection signals RDSEL<1:N> is counted.

The voltage control signal generator 25 may include a control signal generator 251 and an internal address generator 252.

The control signal generator 251 may receive the rupture control signal RUPCTR, the fuse data FZD, the second internal command signal REN, the third internal command signal RDIS, and the fourth internal command signal RON to generate a first voltage control signal RUPEX and a pre-voltage control signal BTM. The first voltage control signal RUPEX and the pre-voltage control signal BTM may be enabled if the first to $N^{th}$ repair data MRD<1:N> (where N is a natural number) have a level combination for selecting a failed redundancy word line. The control signal generator 251 may generate first to $N^{th}$ internal repair data IMRD<1:N>, one of is the first to $N^{th}$ internal repair data IMRD<1:N> is selected according to a level combination of the first to $N^{th}$ repair data MRD<1:N>. The control signal generator 251 may generate a pre-charge signal PCG and a latch enablement signal LATEN in response to the second internal clock signal SCLK. The first voltage control signal RUPEX and the pre-voltage control signal BTM may be set to be generated from a point of time that the second internal command signal REN is inputted to the control signal generator 251 until a point of time that the third internal command signal RDIS is inputted to the control signal generator 251. The pre-charge signal PCG and the latch enablement signal LATEN may be set to be generated if the fourth internal command signal RON is inputted to control signal generator 251.

The internal address generator 252 may generate the second voltage control signal BLE. The second voltage control signal BLE may be enabled if the first voltage control signal RUPEX and the pre-voltage control signal BTM are enabled. The internal address generator 252 may sequentially generate the first to $N^{th}$ internal address signals IADD<1:N> (where N is a natural number) in response to the first to $N^{th}$ internal repair data IMRD<1:N> and the first to $N^{th}$ rupture signals RUP<1:N>.

Figure 3:
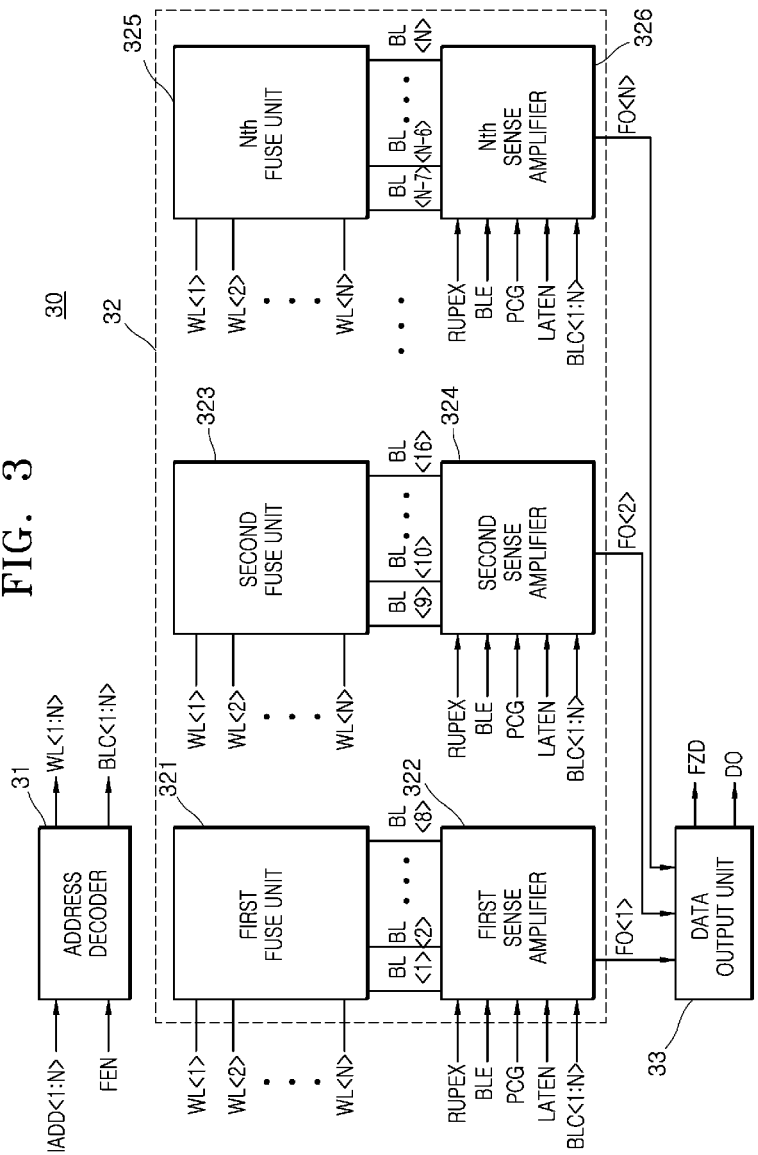
FIG. 3 is a block diagram illustrating a representation of fuse array included in the semiconductor device of FIG. 1.

Referring to FIG. 3, the fuse array 30 may include an address decoder 31, a fuse region 32 and a data output unit 33.

The address decoder 31 may decode the first to $N^{th}$ internal address signals IADD<1:N> to generate first to $N^{th}$ word line signals WL<1:N> and first to $N^{th}$ bit line control signals BLC<1:N>, if the fuse enablement signal FEN is enabled.

The fuse region 32 may be configured to include first to $N^{th}$ fuse units 321, 323, ... and 325 and first to $N^{th}$ sense amplifiers 322, 324, ... and 326.

The first fuse unit 321 may include a plurality of fuse sets (not shown). The fuse sets may be located at intersections of word lines selected by the first to $N^{th}$ word line signals WL<1:N> and first to eighth bit lines BL<1:8> selected by the first to $N^{th}$ bit line control signals BLC<1:N>. Each of the second to $N^{th}$ fuse units 323, ... and 325 may have the same configuration and function as the first fuse unit 321. Thus, detailed descriptions of the second to $N^{th}$ fuse units 323, ... and 325 will be omitted hereinafter.

The first sense amplifier 322 may receive the pre-charge signal PCG to pre-charge the levels of the first to eighth bit lines BL<1:8> and may select any one of the first to eighth bit lines BL<1:8> according to a level combination of the first to $N^{th}$ bit line control signals BLC<1:N>. Moreover, the first sense amplifier 322 may apply a high voltage and a ground voltage (or an internal voltage) to the fuse sets in response to the first voltage control signal RUPEX and the second voltage control signal BLE. In addition, the first sense amplifier 322 may sense and amplify a datum of any one selected from the group consisting of the first to eighth bit lines BL<1:8> in response to the latch enablement signal LATEN to generate a first fuse output signal FO<1>. Each of the second to $N^{th}$ sense amplifiers 324, ... and 326 may have the same configuration and function as the first sense amplifier 322. Thus, detailed descriptions of the second to $N^{th}$ sense amplifiers 324, ... and 326 will be omitted hereinafter.

The data output unit 33 may generate the fuse data FZD and the output data DO. The fuse data FZD and the output data DO may be enabled if at least one of the first to $N^{th}$ fuse output signals FO<1:N> is enabled.

Figure 4:
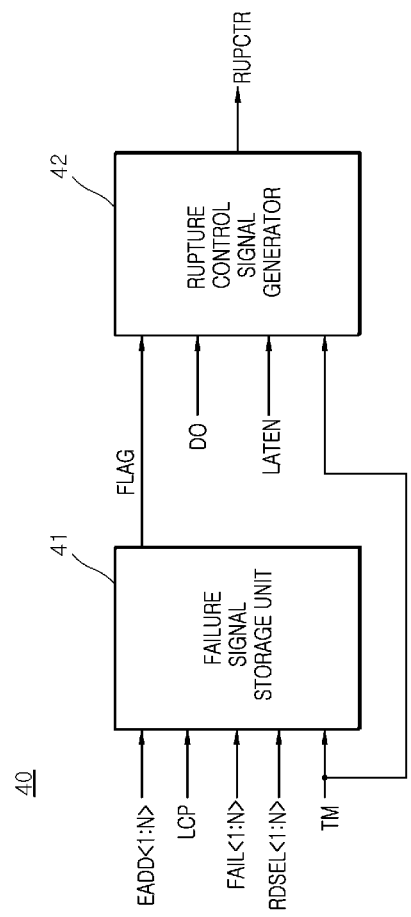
FIG. 4 is a block diagram illustrating a representation of a rupture controller included in the semiconductor device of FIG. 1.

Referring to FIG. 4, the rupture controller 40 may include a failure signal storage unit 41 and a rupture control signal generator 42.

The failure signal storage unit 41 may store any one of the first to $N^{th}$ failure signals FAIL<1:N> (where N is a natural number) therein according to a level combination of the first to $N^{th}$ external address signals EADD<1:N> (where N is a natural number) if the latch pulse signal LCP including a pulse generated in the redundancy test mode is inputted thereto. In addition, the failure signal storage unit 41 may receive the test mode signal TM to generate a flag signal FLAG from the first to $N^{th}$ failure signals FAIL<1:N>. The first to $N^{th}$ failure signals FAIL<1:N> may be stored in the failure signal storage unit 41 according to a level combination of the first to $N^{th}$ selection signals RDSEL<1:N>. The test mode signal TM may be enabled in the test mode.

The rupture control signal generator 42 may receive the test mode signal TM and the latch enablement signal LATEN to generate the rupture control signal RUPCTR if the output data DO is enabled while the flag signal FLAG is enabled.

Figure 5:
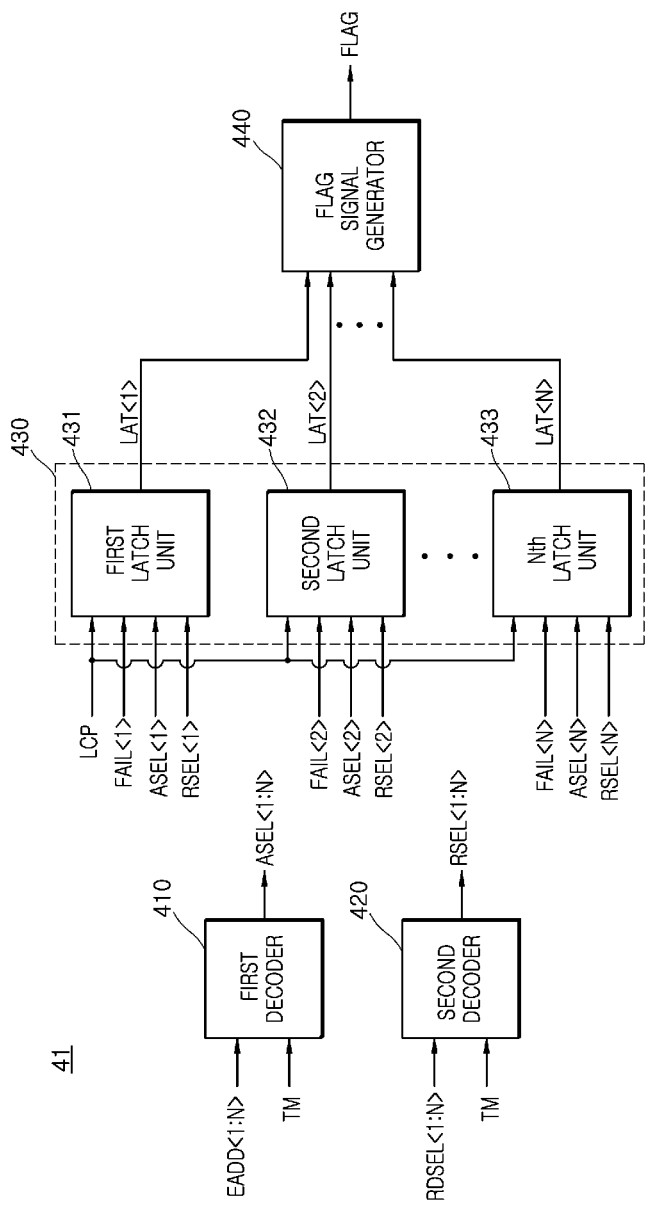
FIG. 5 is a block diagram illustrating a representation of a failure signal storage unit included in the rupture controller of FIG. 4.

Referring to FIG. 5, the failure signal storage unit 41 may include a first decoder 410, a second decoder 420, a latch signal generator 430 and a flag signal generator 440.

The first decoder 410 may decode the first to $N^{th}$ external address signals EADD<1:N> to generate first to $N^{th}$ address selection signals ASEL<1:N>, one of the first to $N^{th}$ address selection signals ASEL<1:N> is selectively enabled, if the test mode signal TM is disabled.

The second decoder 420 may decode the first to $N^{th}$ selection signals RDSEL<1:N> to generate first to $N^{th}$ redundancy selection signals RSEL<1:N>, one of the first to $N^{th}$ redundancy selection signals RSEL<1:N> is selectively enabled, if the test mode signal TM is enabled.

The latch signal generator 430 my include first to $N^{th}$ latch units 431, 432, ... and 433.

The first lath unit 431 may store the failure signal FAIL<1> therein if the latch pulse signal LCP and the first address selection signal ASEL<1> are enabled and may output the stored first failure signal FAIL<1> as a first latch signal LAT<1> if the first redundancy selection signals RSEL<1> is enabled. Each of the second to $N^{th}$ latch units 432, ... and 433 may have the same configuration and function as the first latch unit 431 except input/output signals thereof. Thus, detailed descriptions of the second to $N^{th}$ latch units 432, ... and 433 will be omitted hereinafter.

The flag signal generator 440 may generate the flag signal FLAG. The flag signal FLAG may be enabled if at least one of the first to $N^{th}$ latch signals LAT<1:N> is enabled.

An operation of the semiconductor devices having the aforementioned configurations will be described hereinafter with reference to FIGS. 1 to 5 in conjunction with an example in which a failure occurs to a redundancy word line corresponding to the second failure signal FAIL<2> among the first to $N^{th}$ failure signals FAIL<1:N>.

First, an example in which a redundancy word line corresponding to the first failure signal FAIL<1> among the first to $N^{th}$ failure signals FAIL<1:N> is selected according to a level combination of the first to $N^{th}$ repair data MRD<1:N> will be described hereinafter. If a failure occurs to the redundancy word line corresponding to the second failure signal FAIL<2>, the second failure signal FAIL<2> may be generated to have a logic "low" level and the remaining failure signals FAIL<1> and FAIL<3:N> may be generated to have a logic "high" level.

The enablement signal generator 21 may generate the oscillator enablement signal OSCEN, the rupture enablement signal RUPEN, and the start signal STR. The oscillator enablement signal OSCEN, the rupture enablement signal RUPEN, and the start signal STR are enabled to have a logic "high" level in response to the pulse signal TRGP including a pulse that occurs in the test mode.

The oscillator 22 may receive the oscillator enablement signal OSCEN having a logic "high" level to generate the first internal clock signal LCLK and the second internal clock signal SCLK. The first internal clock signal LCLK and the second internal clock signal SCLK are toggled.

The internal command generator 23 may receive the start signal having a logic "high" level to output the first to fourth internal command signals VRD, REN, RDIS and RON. The first to fourth internal command signals VRD, REN, RDIS and RON are sequentially generated.

The counter 24 may generate the fuse enablement signal FEN in response to the rupture enablement signal RUPEN having a logic "high" level, may generate the first to $N^{th}$ rupture signals RUP<1:N>, the first to $N^{th}$ rupture signals RUP<1:N> are sequentially enabled in response to the first internal command signal VRD. The counter may generate the first to $N^{th}$ selection signal RDSEL<1:N> such that the first selection signal RDSEL<1> among the first to $N^{th}$ selection signal RDSEL<1:N> has a logic "high" level.

The control signal generator 251 of the voltage control signal generator 25 may receive the rupture control signal RUPCTR having a logic "high" level and the fuse data FZD having a logic "high" level to generate the first voltage control signal RUPEX having a logic "high" level and the pre-voltage control signal BTM having a logic "low" level. In addition, the control signal generator 251 may output the first to $N^{th}$ N repair data MRD<1:N> as the first to $N^{th}$ internal repair data IMRD<1:N> and may generate the pre-charge signal PCG and the latch enablement signal LATEN in response to the second internal clock signal SCLK. Initial levels of the rupture control signal RUPCTR and the fuse data FZD may be set to be a logic "high" level.

The internal address generator 252 of the voltage control signal generator 25 may receive the first to $N^{th}$ internal repair data IMRD<1:N> and the first to $N^{th}$ rupture signals RUP<1:N> to sequentially generate the first to $N^{th}$ internal address signals IADD<1:N>. In addition, the internal address generator 252 may receive the first voltage control signal RUPEX having a logic "high" level and the pre-voltage control signal BTM having a logic "low" level to generate the second voltage control signal BLE having a logic "low" level.

The fuse array 30 may receive the pre-charge signal PCG to pre-charge the levels of the first to $N^{th}$ bit lines BL<1:N> and may receive the first voltage control signal BUPEX having a logic "high" level and the second voltage control signal BLE having a logic "low" level not to rupture the fuse sets in the first fuse unit 321 connected to the first to eighth bit lines BL<1:8> selected by the first to $N^{th}$ internal address signals IADD<1:N> that are sequentially generated. In addition, the fuse array 30 may receive the latch enablement signal LATEN to output the fuse data FZD having a logic "high" level and the output data DO having a logic "high" level.

The second decoder 420 of the failure signal storage unit 41 may decode the first to $N^{th}$ selection signals RDSEL<1:N> in response to the test mode signal TM to generate the first to $N^{th}$ redundancy selection signals RSEL<1:N>. The first to $N^{th}$ redundancy selection signals RSEL<1:N> may be generated such that the first redundancy selection signal RSEL<1> among the first to $N^{th}$ redundancy selection signals RSEL<1:N> has a logic "high" level.

The latch signal generator 430 may receive the first to $N^{th}$ redundancy selection signals RSEL<1:N> to generate the first to $N^{th}$ latch signals LAT<1:N>. The first to $N^{th}$ latch signals LAT<1:N> may be generated such that the first latch signal LAT<1> among the first to $N^{th}$ latch signals LAT<1:N> has a logic "high" level. In such examples, the second to $N^{th}$ latch signals LAT<2:N> may also be generated to have a logic "high" level.

The flag signal generator 440 may generate the flag signal FLAG having a logic "high" level because all of the first to $N^{th}$ latch signals LAT<1:N> have a logic "high" level.

The rupture control signal generator 42 may receive the flag signal FLAG having a logic "high" level and the output data DO having a logic "high" level to generate the rupture control signal RUPCTR having a logic "high" level. In such examples, the rupture control signal generator 42 may receive the latch enablement signal LATEN to latch the rupture control signal RUPCTR.

The counter 24 may generate the fuse enablement signal FEN in response to the rupture enablement signal RUPEN having a logic "high" level, may generate the first to $N^{th}$ rupture signals RUP<1:N> sequentially enabled in response to the first internal command signal VRD, and may generate the first to $N^{th}$ selection signal RDSEL<1:N> such that the first selection signal RDSEL<1> among the first to $N^{th}$ selection signal RDSEL<1:N> has a logic "high" level.

The control signal generator 251 of the voltage control signal generator 25 may receive the rupture control signal RUPCTR having a logic "high" level and the fuse data FZD having a logic "high" level to generate the first voltage control signal RUPEX having a logic "high" level and the pre-voltage control signal BTM having a logic "low" level. In addition, the control signal generator 251 may output the first to $N^{th}$ N repair data MRD<1:N> as the first to $N^{th}$ internal repair data IMRD<1:N> and may generate the pre-charge signal PCG and the latch enablement signal LATEN. That is, the control signal generator 251 may generate the first voltage control signal RUPEX having a logic "high" level and the pre-voltage control signal BTM having a logic "low" level because the rupture control signal RUPCTR having a logic "high" level is inputted thereto.

The internal address generator 252 of the voltage control signal generator 25 may receive the first to $N^{th}$ internal repair data IMRD<1:N> and the first to $N^{th}$ rupture signals RUP<1:N> sequentially generated to sequentially generate the first to $N^{th}$ internal address signals IADD<1:N>. In addition, the internal address generator 252 may receive the first voltage control signal RUPEX having a logic "high" level and the pre-voltage control signal BTM having a logic "low" level to generate the second voltage control signal BLE having a logic "low" level.

The fuse array 30 may receive the pre-charge signal PCG to pre-charge the levels of the first to $N^{th}$ bit lines BL<1:N> and may receive the first voltage control signal BUPEX having a logic "high" level and the second voltage control signal BLE having a logic "low" level not to rupture the fuse sets in the first fuse unit 321 selected by the first to $N^{th}$ internal address signals IADD<1:N> that are sequentially generated. In addition, the fuse array 30 may receive the latch enablement signal LATEN to output the fuse data FZD having a logic "high" level and the output data DO having a logic "high" level.

Next, an example in which a redundancy word line corresponding to the second failure signal FAIL<2> among the first to $N^{th}$ failure signals FAIL<1:N> is selected according to a level combination of the first to N$^{th}$ repair data MRD<1:N> will be described hereinafter. If a failure occurs to the redundancy word line corresponding to the second failure signal FAIL<2>, the second failure signal FAIL<2> may be generated to have a logic "low" level and the remaining failure signals FAIL<1> and FAIL<3:N> may be generated to have a logic "high" level.

The enablement signal generator 21 may generate the oscillator enablement signal OSCEN, the rupture enablement signal RUPEN, and the start signal STR. The oscillator enablement signal OSCEN, the rupture enablement signal RUPEN, and the start signal STR are enabled to have a logic "high" level in response to the pulse signal TRGP including a pulse that occurs in the test mode.

The oscillator 22 may receive the oscillator enablement signal OSCEN having a logic "high" level to generate the first internal clock signal LCLK and the second internal clock signal SCLK. The first internal clock signal LCLK and the second internal clock signal SCLK are toggled.

The internal command generator 23 may receive the start signal having a logic "high" level to output the first to fourth internal command signals VRD, REN, RDIS and RON. The first to fourth internal command signals VRD, REN, RDIS and RON are sequentially generated.

The counter 24 may generate the fuse enablement signal FEN in response to the rupture enablement signal RUPEN having a logic "high" level, may generate the first to N$^{th}$ rupture signals RUP<1:N>. The first to N$^{th}$ rupture signals RUP<1:N> are sequentially enabled in response to the first internal command signal VRD, and the counter 24 may generate the first to N$^{th}$ selection signal RDSEL<1:N> such that the first selection signal RDSEL<1> among the first to N$^{th}$ selection signal RDSEL<1:N> has a logic "high" level.

The control signal generator 251 of the voltage control signal generator 25 may receive the rupture control signal RUPCTR having a logic "high" level and the fuse data FZD having a logic "high" level to generate the first voltage control signal RUPEX having a logic "high" level and the pre-voltage control signal BTM having a logic "low" level. In addition, the control signal generator 251 may output the first to N$^{th}$ repair data MRD<1:N> as the first to N$^{th}$ internal repair data IMRD<1:N> and may generate the pre-charge signal PCG and the latch enablement signal LATEN in response to the second internal clock signal SCLK.

The internal address generator 252 of the voltage control signal generator 25 may receive the first to N$^{th}$ internal repair data IMRD<1:N> and the first to N$^{th}$ rupture signals RUP<1:N> to sequentially generate the first to N$^{th}$ internal address signals IADD<1:N>. In addition, the internal address generator 252 may receive the first voltage control signal RUPEX having a logic "high" level and the pre-voltage control signal BTM having a logic "low" level to generate the second voltage control signal BLE having a logic "low" level.

The fuse array 30 may receive the pre-charge signal PCG to pre-charge the levels of the first to N$^{th}$ bit lines BL<1:N> and may receive the first voltage control signal BUPEX having a logic "high" level and the second voltage control signal BLE having a logic "low" level not to rupture the fuse sets in the second fuse unit 323 selected by the first to N$^{th}$ internal address signals IADD<1:N> that are sequentially generated. In addition, the fuse array 30 may receive the latch enablement signal LATEN to output the fuse data FZD having a logic "high" level and the output data DO having a logic "high" level.

The second decoder 420 of the failure signal storage unit 41 may decode the first to N$^{th}$ selection signals RDSEL<1:N> in response to the test mode signal TM to generate the first to N$^{th}$ redundancy selection signals RSEL<1:N> such that the second redundancy selection signal RSEL<2> among the first to N$^{th}$ redundancy selection signals RSEL<1:N> has a logic "high" level.

The latch signal generator 430 may receive the first to N$^{th}$ redundancy selection signals RSEL<1:N> to generate the first to N$^{th}$ latch signals LAT<1:N> such that the second latch signal LAT<2> among the first to N$^{th}$ latch signals LAT<1:N> has a logic "low" level. In such examples, the remaining latch signals LAT<1> and LAT<3:N> may be generated to have a logic "high" level.

The flag signal generator 440 may generate the flag signal FLAG having a logic "low" level because the second latch signal LAT<2> among the first to N$^{th}$ latch signals LAT<1:N> has a logic "low" level.

The rupture control signal generator 42 may receive the flag signal FLAG having a logic "low" level and the output data DO having a logic "high" level to generate the rupture control signal RUPCTR having a logic "low" level. In such examples, the rupture control signal generator 42 may receive the latch enablement signal LATEN to latch the rupture control signal RUPCTR.

The counter 24 may generate the first to N$^{th}$ rupture signals RUP<1:N>. The first to N$^{th}$ rupture signals RUP<1:N> are sequentially enabled in response to the first internal command signal VRD and the counter 24 may generate the first to N$^{th}$ selection signal RDSEL<1:N> such that the first selection signal RDSEL<1> among the first to N$^{th}$ selection signal RDSEL<1:N> has a logic "high" level.

The control signal generator 251 of the voltage control signal generator 25 may receive the rupture control signal RUPCTR having a logic "low" level and the fuse data FZD having a logic "high" level to generate the first voltage control signal RUPEX having a logic "high" level and the pre-voltage control signal BTM having a logic "high" level. In addition, the control signal generator 251 may output the first to N$^{th}$ repair data MRD<1:N> as the first to N$^{th}$ internal repair data IMRD<1:N> and may generate the pre-charge signal PCG and the latch enablement signal LATEN. That is, the control signal generator 251 may generate the first voltage control signal RUPEX having a logic "high" level and the pre-voltage control signal BTM having a logic "high" level because the rupture control signal RUPCTR having a logic "low" level is inputted thereto.

The internal address generator 252 of the voltage control signal generator 25 may receive the first to N$^{th}$ internal repair data IMRD<1:N> and the first to N$^{th}$ rupture signals RUP<1:N> sequentially generated to sequentially generate the first to N$^{th}$ internal address signals IADD<1:N>. In addition, the internal address generator 252 may receive the first voltage control signal RUPEX having a logic "high" level and the pre-voltage control signal BTM having a logic "high" level to generate the second voltage control signal BLE having a logic "high" level.

The fuse array 30 may receive the pre-charge signal PCG to pre-charge the levels of the first to N$^{th}$ bit lines BL<1:N> and may receive the first voltage control signal BUPEX having a logic "high" level and the second voltage control signal BLE having a logic "high" level to rupture the fuse sets in the second fuse unit 323 selected by the first to N$^{th}$ internal address signals IADD<1:N> that are sequentially generated. In addition, the fuse array 30 may receive the latch enablement signal LATEN to output the fuse data FZD having a logic "low" level and the output data DO having a logic "low" level.

Operations of the test mode for selecting redundancy word lines corresponding to the third to N$^{th}$ failure signals FAIL<3:

N> according to level combinations of the first to N$^{th}$ repair data MRD<1:N> may be the same as the operation for selecting the redundancy word line corresponding to the first failure signal FAIL<1>, which is described above. Thus, descriptions of the operations for selecting redundancy word lines corresponding to the third to N$^{th}$ failure signals FAIL<3:N> will be omitted.

The semiconductor device having the aforementioned configuration may automatically cut fuse sets for selecting failed redundancy word lines to reduce the time that may be required to cut the fuse sets.

Figure 6:
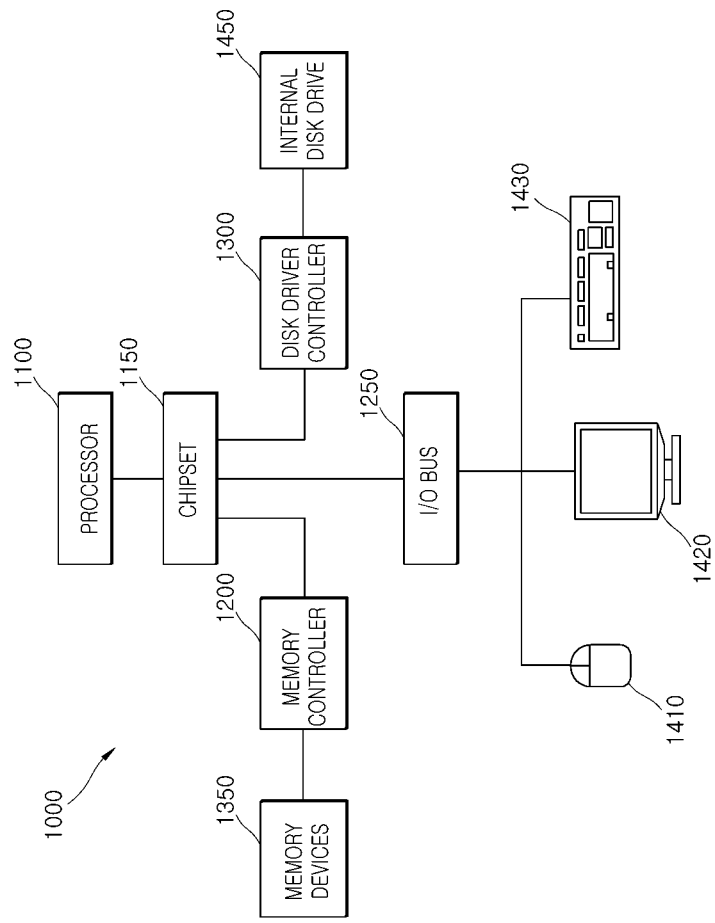
FIG. 6 illustrates a block diagram of an example of a representation of a system employing the semiconductor devices in accordance with the embodiments discussed above with relation to FIGS. 1-5.

The semiconductor devices discussed above (see FIGS. 1-5) are particular useful in the design of memory devices, processors, and computer systems. For example, referring to FIG. 6, a block diagram of a system employing the semiconductor devices in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor device as discussed above with reference to FIGS. 1-5. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device as discussed above with relation to FIGS. 1-5, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 6 is merely one example of a system employing the semiconductor devices as discussed above with relation to FIGS. 1-5. In alternate embodiments, such as cellular phones or digital cameras, the components may differ from the embodiments illustrated in FIG. 6.

What is claimed is:

1. A semiconductor device comprising:
   a fuse controller configured to generate internal address signals according to a level combination of repair data and configured to generate first and second voltage control signals in response to a rupture control signal enabled to rupture a predetermined fuse set for selecting a failed redundancy word line, in a test mode; and
   a fuse array including a plurality of fuse sets including the predetermined fuse set,
   wherein each of the plurality of fuse sets is selected according to a level combination of the internal address signals,
   wherein the fuse array ruptures the predetermined fuse set for selecting the failed redundancy word line in response to the first and second voltage control signals to output fuse data,
   wherein the first and second voltage control signals are enabled if the repair data have the level combination for selecting the failed redundancy word line.

2. The semiconductor device of claim 1,
   wherein the plurality of fuse sets include a plurality of transistor-type e-fuses, and
   wherein the plurality of transistor-type e-fuses include gate insulation layers that are configured to be ruptured by a voltage difference between two different voltages generated by the first and second voltage control signals.

3. The semiconductor device of claim 1, wherein the test mode is an operation for rupturing an insulation layer of the predetermined fuse set, that selects the failed redundancy word line, among the plurality of fuse sets sequentially selected according to the level combination of the internal address signals.

4. The semiconductor device of claim 1, wherein the fuse controller includes:
   an enablement signal generator configured to generate an oscillator enablement signal, a rupture enablement signal, and a start signal, and configured to enable the oscillator enablement signal, the rupture enablement signal, and the start signal in response to a pulse signal including a pulse that occurs in the test mode;
   an oscillator configured to receive the oscillator enablement signal to generate a first internal clock signal and a second internal clock signal, and the oscillator configured to toggle the first internal clock signal and the second internal clock signal;
   an internal command generator configured to output a first internal command signal, a second internal command signal, a third internal command signal, and a fourth internal command signal, and configured to sequentially generate the first internal command signal, the second internal command signal, the third internal command signal, and the fourth internal command signal in response to the start signal;

a counter configured to generate a fuse enablement signal enabled in response to the rupture enablement signal, configured to generate rupture signals sequentially enabled in response to the first internal command signal, and configured to generate selection signals sequentially enabled in response to the first internal command signal VRD; and a voltage control signal generator configured to receive the rupture control signal and the fuse data to generate the first and second voltage control signals from the fuse data if the repair data have the level combination for selecting the failed redundancy word line.

5. The semiconductor device of claim 4, wherein the voltage control signal generator includes:

a control signal generator configured to receive the rupture control signal to generate the first voltage control signal and a pre-voltage control signal from the fuse data if the repair data have a level combination for selecting the failed redundancy word line, configured to generate internal repair data, one of the internal repair data is selected according to the level combination of the repair data, and configured to generate a pre-charge signal and a latch enablement signal in response to the second internal clock signal; and an internal address generator configured to generate the second voltage control signal enabled in response to the first voltage control signal and the pre-voltage control signal BTM, and configured to generate the internal address signals from the internal repair data.

6. The semiconductor device of claim 4, wherein a toggle cycle time of the first internal clock signal is different from a toggle cycle time of the second internal clock signal.

7. The semiconductor device of claim 1, wherein the fuse array includes:

an address decoder configured to receive a fuse enablement signal to generate word line signals and bit line control signals, and configured to select word line signals and bit line control signals according to the level combination of the internal address signals received by the address decoder;

a fuse region including the plurality of fuse sets, the fuse sets selected according to a level combination of the word line signals and the bit line control signals, wherein the fuse region is configured to rupture insulation layers of the plurality of fuse sets using the first and second voltage control signals and is suitable of sensing and amplifying data of the plurality of fuse sets to generate a plurality of fuse output signals; and a data output unit configured to generate the fuse data and output data, wherein the fuse data and the output data are enabled if at least one of the fuse output signals is enabled.

8. The semiconductor device of claim 7, wherein the plurality of fuse sets include a plurality of first fuse sets and a plurality of second fuse sets; and wherein the fuse region includes:

a first fuse unit including the plurality of first fuse sets located at intersections of word lines selected by the word line signals and a first group of bit lines selected by the bit line control signals;

a first sense amplifier configured to receive a pre-charge signal to pre-charge the first group of bit lines, configured to receive the first and second voltage control signals to apply a high voltage and any one of a ground voltage and an internal voltage to the plurality of first fuse sets connected to the first group of bit lines selected by the bit line control signals, and configured to sense and amplify a datum of any one of the first group of bit lines in response to the latch enablement signal to generate a first fuse output signal of the plurality of fuse output signals;

a second fuse unit including the plurality of second fuse sets located at intersections of the word lines selected by the word line signals and a second group of bit lines selected by the bit line control signals; and a second sense amplifier configured to receive the pre-charge signal to pre-charge the second group of bit lines, configured to receive the first and second voltage control signals to apply the high voltage and any one of the ground voltage and the internal voltage to the plurality of second fuse sets connected to the second group of bit lines selected by the bit line control signals, and configured to sense and amplify a datum of any one of the second group of bit lines in response to the latch enablement signal to generate a second fuse output signal of the plurality of fuse output signals.

9. The semiconductor device of claim 8, wherein the insulation layers of the first and second fuse sets are ruptured if the high voltage and the ground voltage are applied to the insulation layers of the first and second fuse sets; and wherein the insulation layers of the first and second fuse sets are not ruptured if the high voltage and the internal voltage are applied to the insulation layers of the first and second fuse sets.

10. The semiconductor device of claim 8, wherein the internal voltage is lower than the high voltage and is higher than the ground voltage.

11. The semiconductor device of claim 1, further comprising a memory cell array, the memory cell array including:

a plurality of redundancy word lines, wherein the memory cell array is configured for testing in a redundancy test mode and is configured for generating failure signals including information on a location of the failed redundancy word line.

12. A semiconductor device comprising:

a fuse controller configured to generate internal address signals according to a level combination of repair data and configured to generate first and second voltage control signals in response to a rupture control signal, in a test mode;

a fuse array configured to include a plurality of fuse sets selected according to a level combination of the internal address signals and configured to rupture the plurality of fuse sets in response to the first and second voltage control signals to output a fuse data and an output data; and a rupture controller configured to store failure signals including information on a location of a failed redundancy word line of a plurality of redundancy word lines included in a memory cell array and configured to generate the rupture control signal according to a level combination of the failure signals in response to the output data, wherein the first and second voltage control signals are enabled if the repair data have the level combination for selecting the failed redundancy word line.

13. The semiconductor device of claim 12, wherein the plurality of fuse sets include a plurality of transistor-type e-fuses, and wherein the plurality of transistor-type e-fuses include gate insulation layers that are configured to rupture by a voltage difference between two different voltages generated by the first and second voltage control signals.

14. The semiconductor device of claim 12, wherein the test mode is an operation for rupturing an insulation layer of a predetermined fuse set, that selects the failed redundancy word line, among the plurality of fuse sets sequentially selected according to the level combination of the internal address signals.

15. The semiconductor device of claim 12, wherein the rupture control signal is enabled to rupture a predetermined fuse set among the plurality of fuse sets, that select the failed redundancy word line.

16. The semiconductor device of claim 12, wherein the fuse controller includes:
- an enablement signal generator configured to generate an oscillator enablement signal, a rupture enablement signal, and a start signal, and configured to enable the oscillator enablement signal, the rupture enablement signal, and the start signal in response to a pulse signal including a pulse that occurs in the test mode;
- an oscillator configured to receive the oscillator enablement signal to generate a first internal clock signal and a second internal clock signal, and the oscillator configured to toggle the first internal clock signal and the second internal clock signal;
- an internal command generator configured to output a first internal command signal, a second internal command signal, a third internal command signal, and a fourth internal command signal, and configured to sequentially generate the first internal command signal, the second internal command signal, the third internal command signal, and the fourth internal command signal in response to the start signal;
- a counter configured to generate a fuse enablement signal enabled in response to the rupture enablement signal, configured to generate rupture signals sequentially enabled in response to the first internal command signal, and configured to generate selection signals sequentially enabled in response to the first internal command signal VRD; and
- a voltage control signal generator configured to receive the rupture control signal and the fuse data to generate the first and second voltage control signals from the fuse data if the repair data have the level combination for selecting the failed redundancy word line.

17. The semiconductor device of claim 16, wherein the voltage control signal generator includes:
- a control signal generator configured to receive the rupture control signal to generate the first voltage control signal and a pre-voltage control signal from the fuse data if the repair data have the level combination for selecting the failed redundancy word line, configured to generate internal repair data, one of the internal repair data is selected according to the level combination of the repair data, and configured to generate a pre-charge signal and a latch enablement signal in response to the second internal clock signal; and
- an internal address generator configured to generate the second voltage control signal enabled in response to the first voltage control signal and the pre-voltage control signal BTM, and configured to generate the internal address signals from the internal repair data.

18. The semiconductor device of claim 16, wherein a toggle cycle time of the first internal clock signal is different from a toggle cycle time of the second internal clock signal.

19. The semiconductor device of claim 12, wherein the fuse array includes:
- an address decoder configured to receive a fuse enablement signal to generate word line signals and bit line control signals, and configured to select word line signals and bit line control signals according to the level combination of the internal address signals received by the address decoder;
- a fuse region including the plurality of fuse sets, the fuse sets selected according to a level combination of the word line signals and the bit line control signals, wherein the fuse region is configured to rupture insulation layers of the plurality of fuse sets using the first and second voltage control signals and is suitable of sensing and amplifying data of the plurality of fuse sets to generate a plurality of fuse output signals; and
- a data output unit configured to generate the fuse data and output data,
wherein the fuse data and the output data are enabled if at least one of the fuse output signals is enabled.

20. The semiconductor device of claim 19,
wherein the plurality of fuse sets include a plurality of first fuse sets and a plurality of second fuse sets; and
wherein the fuse region includes:
- a first fuse unit including the plurality of first fuse sets which are located at intersections of word lines selected by the word line signals and a first group of bit lines selected by the bit line control signals;
- a first sense amplifier configured to receive a pre-charge signal to pre-charge the first group of bit lines, configured to receive the first and second voltage control signals to apply a high voltage and any one of a ground voltage and an internal voltage to the plurality of first fuse sets connected to the first group of bit lines selected by the bit line control signals, and configured to sense and amplify a datum of any one of the first group of bit lines in response to the latch enablement signal to generate a first fuse output signal of the plurality of fuse output signals;
- a second fuse unit including the plurality of second fuse sets located at intersections of the word lines selected by the word line signals and a second group of bit lines selected by the bit line control signals; and
- a second sense amplifier configured to receive the pre-charge signal to pre-charge the second group of bit lines, configured to receive the first and second voltage control signals to apply the high voltage and any one of the ground voltage and the internal voltage to the plurality of second fuse sets connected to the second group of bit lines selected by the bit line control signals, and configured to sense and amplify a datum of any one of the second group of bit lines in response to the latch enablement signal to generate a second fuse output signal of the plurality of fuse output signals.

21. The semiconductor device of claim 20,
wherein the insulation layers of the first and second fuse sets are ruptured if the high voltage and the ground voltage are applied to the insulation layers of the first and second fuse sets; and
wherein the insulation layers of the first and second fuse sets are not ruptured if the high voltage and the internal voltage are applied to the insulation layers of the first and second fuse sets.

22. The semiconductor device of claim 20, wherein the internal voltage is lower than the high voltage and is higher than the ground voltage.

23. The semiconductor device of claim 12, wherein the rupture controller includes:
- a failure signal storage unit configured to receive a latch pulse signal to store the failure signals therein according to a level combination of external address signals and configured to receive a test mode signal to generate a flag signal from the stored failure signals according to a level combination of selection signals; and a rupture control signal generator configured to receive the test mode signal and a latch enablement signal to generate the rupture control signal if the output data is enabled while the flag signal is enabled.

24. The semiconductor device of claim 23, wherein the failure signal storage unit includes:

a first decoder configured to decode the external address signals in response to the test mode signal to generate address selection signals;

a second decoder configured to decode the selection signals in response to the test mode signal to generate to generate redundancy selection signals;

a latch signal generator configured to store the failure signals therein according to a level combination of the address selection signals in response to the latch pulse signal and configured to output the stored failure signals as latch signals according to a level combination of the redundancy selection signals; and a flag signal generator configured to generate the flag signal, wherein the flag signal is enabled if at least one of the latch signals is enabled.

* * * * *